(12) United States Patent
Jung et al.

(10) Patent No.: US 10,403,838 B2
(45) Date of Patent: Sep. 3, 2019

(54) PHOTOELECTRIC CONVERSION DEVICE

(71) Applicant: Kabushiki Kaisha Toshiba, Minato-ku (JP)

(72) Inventors: Hyangmi Jung, Yokohama (JP); Atsuko Iida, Yokohama (JP); Takeshi Gotanda, Yokohama (JP); Hideyuki Nakao, Setagaya (JP); Shigehiko Mori, Kawasaki (JP); Kenji Todori, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/258,517

(22) Filed: Sep. 7, 2016

(65) Prior Publication Data

US 2017/0062748 A1 Mar. 2, 2017

Related U.S. Application Data

(63) Continuation of application No. PCT/JP2015/004800, filed on Sep. 18, 2015.

(30) Foreign Application Priority Data

Sep. 22, 2014 (JP) .................................. 2014-192518

(51) Int. Cl.
*H01L 51/44* (2006.01)
*H01L 31/0203* (2014.01)
(Continued)

(52) U.S. Cl.
CPC ........ *H01L 51/441* (2013.01); *H01L 31/0203* (2013.01); *H01L 31/0216* (2013.01);
(Continued)

(58) Field of Classification Search
CPC ..... H01L 31/00; H01L 31/02; H01L 31/0203; H01L 31/0216; H01L 31/02167;
(Continued)

(56) References Cited

U.S. PATENT DOCUMENTS 6,960,877 B1 11/2005 Heeks et al.
7,256,542 B2 8/2007 Chiu et al.
(Continued)

FOREIGN PATENT DOCUMENTS

CN 1642367 7/2005
CN 101632010 1/2010
(Continued)

OTHER PUBLICATIONS

Definition of "separate" from the Oxford Dictionary retrieved on Aug. 31, 2018 from https://en.oxforddictionaries.com/definition/separate.*

(Continued)

*Primary Examiner* — Christina Chern
(74) *Attorney, Agent, or Firm* — Oblon, McClelland, Maier & Neustadt, L.L.P.

(57) ABSTRACT

A photoelectric conversion device includes: an element substrate having a first electrode, a photoelectric conversion layer, and a second electrode, the photoelectric conversion layer being provided above the first electrode and performing charge separation by energy of irradiated light, and the second electrode being provided above the photoelectric conversion layer; a counter substrate facing the element substrate; and a sealing layer provided between the element substrate and the counter substrate. The element substrate, the counter substrate, and the sealing layer define a sealing region sealing the photoelectric conversion layer. The element substrate further has: an impurity detection layer in contact with the second electrode inside the sealing region (Continued)

and causing chemical reaction with an impurity containing at least one of oxygen and water; and a third electrode in contact with the impurity detection layer and extending to the outside of the sealing region.

19 Claims, 6 Drawing Sheets

(51) Int. Cl.
    *H01L 31/0216*     (2014.01)
    *H02S 50/10*     (2014.01)

(52) U.S. Cl.
    CPC .......... *H01L 51/448* (2013.01); *H02S 50/10* (2014.12); *Y02E 10/549* (2013.01)

(58) Field of Classification Search
    CPC ....... H01L 31/04; H01L 31/048; H01L 51/00; H01L 51/0001; H01L 51/42; H01L 51/44; H01L 51/448
    See application file for complete search history.

(56) References Cited

U.S. PATENT DOCUMENTS

| | | | |
|---|---|---|---|
| 2003/0143423 A1* | 7/2003 | McCormick | H01L 51/5237 428/690 |
| 2007/0131944 A1 | 6/2007 | Hu et al. | |
| 2009/0289202 A1* | 11/2009 | Yakimov | H01L 51/5259 250/473.1 |
| 2010/0276818 A1 | 11/2010 | Maindron et al. | |
| 2010/0294024 A1 | 11/2010 | Kumar et al. | |
| 2010/0301320 A1* | 12/2010 | Rand | B82Y 10/00 257/40 |
| 2012/0125431 A1 | 5/2012 | Oizumi et al. | |

FOREIGN PATENT DOCUMENTS

| | | |
|---|---|---|
| CN | 102804440 | 11/2012 |
| EP | 2 448 032 A1 | 5/2012 |
| JP | 2002-532847 | 10/2002 |
| JP | 2004-119086 | 4/2004 |
| JP | 2004-349169 | 12/2004 |
| JP | 2007-157687 | 6/2007 |
| JP | 2010-515050 | 5/2010 |
| JP | 2011-507252 | 3/2011 |
| JP | 2013-254768 | 12/2013 |
| JP | 5382119 | 1/2014 |
| KR | 10-2010-0014342 | 2/2010 |
| KR | 10-2012-0111944 | 10/2012 |
| TW | 200528703 | 12/1993 |
| TW | 200848711 | 12/1996 |
| TW | 201115804 | 5/2011 |
| WO | WO 2008/082362 A1 | 7/2008 |
| WO | WO 2010/150759 A1 | 12/2010 |

OTHER PUBLICATIONS

Definition of "isolate" from https://www.dictionary.com/browse/isolate retrieved on Dec. 21, 2018.*
International Search Report dated Dec. 1, 2015 in PCT/JP2015/004800, filed on Sep. 18, 2015 ( with English Translation).
Written Opinion dated Dec. 1, 2015 in PCT/JP2015/004800, filed on Sep. 18, 2015.

* cited by examiner

PHOTOELECTRIC CONVERSION DEVICE

CROSS-REFERENCE TO RELATED APPLICATIONS

This application is a continuation of prior International Application No. PCT/JP2015/004800 filed on Sep. 18, 2015, which is based upon and claims the benefit of priority from Japanese Patent Application No. 2014-192518 filed on Sep. 22, 2014; the entire contents of all of which are incorporated herein by reference.

FIELD

Embodiments disclosed herein generally relate to a photoelectric conversion device.

BACKGROUND

An organic thin-film solar cell being one of photoelectric conversion devices, which is lighter in weight and more flexible, for example, than a silicon solar cell or the like and can be manufactured at a low cost, attracts attention as a next-generation solar cell.

The organic thin-film solar cell is provided between an anode and a cathode, and has a photoelectric conversion element which has a photoactive layer forming pn junction. In the organic thin-film solar cell, as a result that irradiated light such as sunlight is absorbed by the active layer, excitons are generated by photoexcitation and diffused to a pn junction interface, where charge separation is carried out to make obtained electrons migrate to a cathode side as well as to make positive holes migrate to an anode side, whereby power generation is performed.

The photoactive layer in the organic thin-film solar cell is quite easy to be deteriorated under an air atmosphere or the like, since an organic semiconductor is used therein. Thus, in the organic thin-film solar cell, a sealing layer is formed between an element substrate in which the photoelectric conversion element is provided and a counter substrate, whereby a sealing region which seals at least the photoactive layer is formed. At this time, if a sealing failure such as unapplying, uncuring, or deterioration of the sealing layer occurs, an impurity such as oxygen or water enters the sealing region, to deteriorate the photoactive layer. Deterioration of the photoactive layer is one of causes of reduction of a conversion efficiency.

However, checking a state of sealing is difficult and inspecting whether or not the impurity has entered the sealing region has been difficult. For example, if an impurity concentration in the sealing region can be determined in a manufacturing stage, it becomes possible to ship only a good-quality product without sealing failure.

DETAILED DESCRIPTION

A photoelectric conversion device includes: an element substrate having a first electrode, a photoelectric conversion layer, and a second electrode, the photoelectric conversion layer being provided above the first electrode and performing charge separation by energy of irradiated light, and the second electrode being provided above the photoelectric conversion layer; a counter substrate facing the element substrate; and a sealing layer provided between the element substrate and the counter substrate. The element substrate, the counter substrate, and the sealing layer define a sealing region sealing the photoelectric conversion layer. The element substrate further has: an impurity detection layer in contact with the second electrode inside the sealing region and causing chemical reaction with an impurity containing at least one of oxygen and water; and a third electrode in contact with the impurity detection layer and extending to the outside of the sealing region.

(First Embodiment)

Figure 1A:
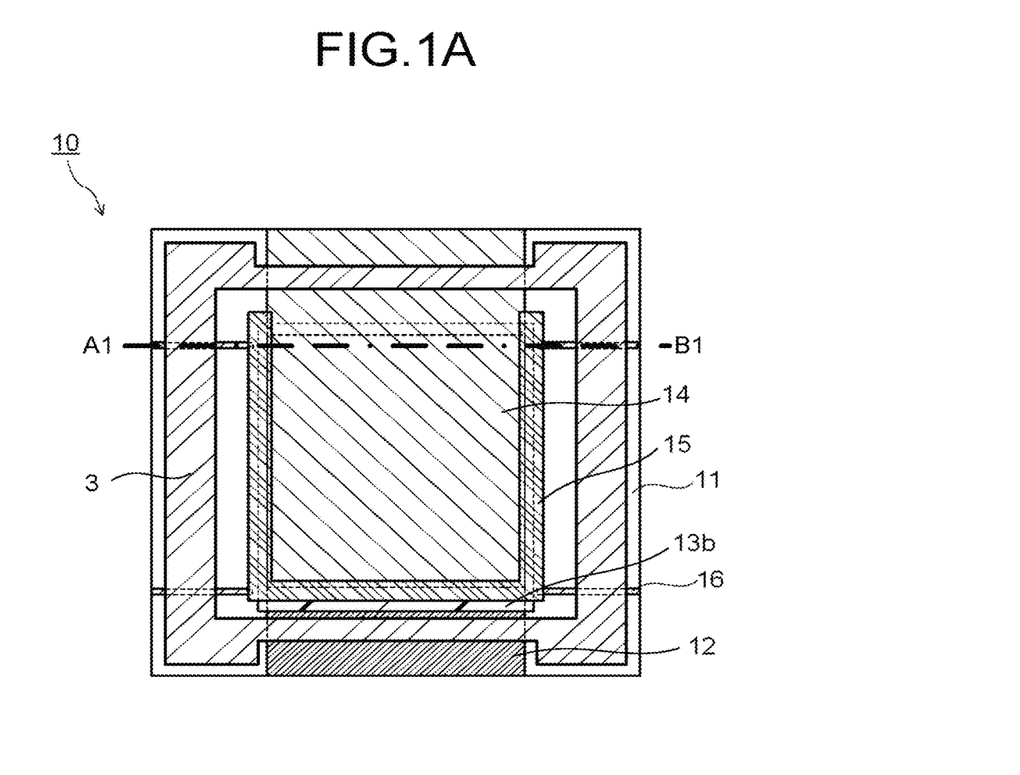
FIG. 1A is a plan view showing a structure example of a photoelectric conversion device.
Figure 1B:
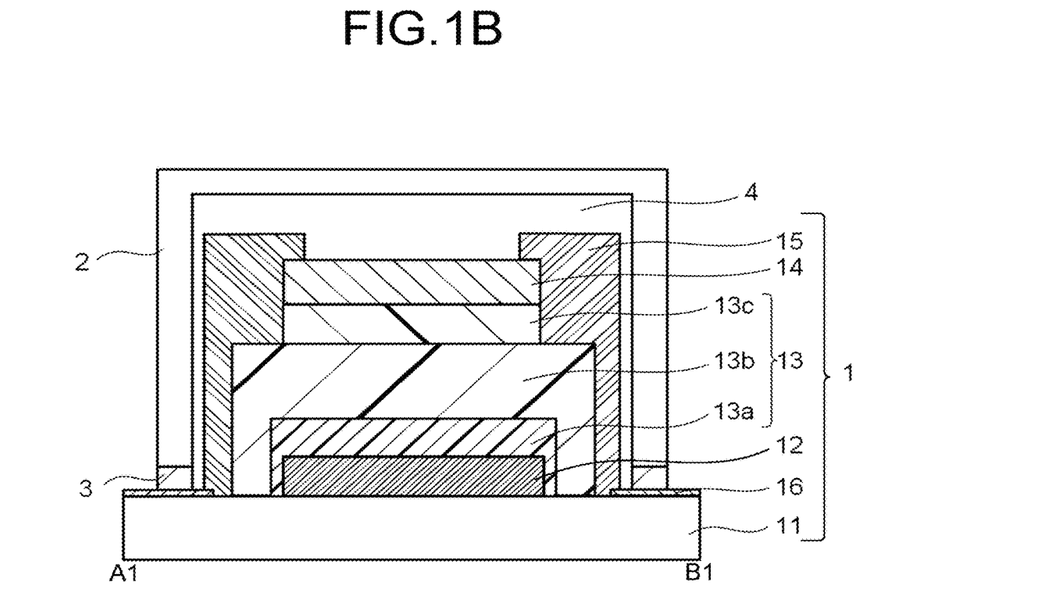
FIG. 1B is a cross-sectional view showing the structure example of the photoelectric conversion device.

FIG. 1 are schematic views showing a structure example of a photoelectric conversion device, FIG. 1A being a plan view and FIG. 1B being a cross-sectional view taken along a line A1-B1 in FIG. 1A.

The photoelectric conversion device 10 shown in FIG. 1 has an element substrate 1, a counter substrate 2, and a sealing layer 3. Further, the photoelectric conversion device 10 has a sealing region surrounded by the element substrate 1, the counter substrate 2, and the sealing layer 3. Note that in FIG. 1A the counter substrate 2 is omitted for the sake of convenience.

The element substrate 1 is a substrate which has a photoelectric conversion element. The element substrate 1 has a substrate (also referred to as an element formation substrate) 11, an electrode 12 provided above the substrate 11, a photoelectric conversion layer 13 provided above the electrode 12, an electrode 14 provided above the photoelectric conversion layer 13, an impurity detection layer 15 provided inside the sealing region 4 in a manner to be in contact with the electrode 14, and an electrode 16 which is in contact with the impurity detection layer 15 and extends to the outside of the sealing region 4.

As the substrate 11, it is possible to use, for example, an inorganic material such as non-alkali glass or quartz glass, plastic such as polyethylene, polyethylene terephthalate (PET), polyethylene naphthalate (PEN), polyimide, polyamide, polyamide-imide, liquid crystal polymer, or cycloolefin polymer, a polymer film, or the like. The substrate 11, above which formation of an electrode is possible, is preferable to be hard to be altered by heat or an organic solvent. In a case where light is made incident via the substrate 11, the substrate 11 has a light transmitting property. Further, the substrate 11 is not limited thereto and it is possible to use, for example, stainless steel (SUS), a silicon substrate, a metal substrate, or the like. At this time, at least a part of a plane of the substrate 11 is preferable to have an insulation surface. A thickness of the substrate 11 is not limited in particular as long as the substrate 11 has a sufficient strength to support other composing members.

The electrode 12 is provided in a manner to extend from the inside of the sealing region 4 to the outside thereof. Another electrode to be an electrode pad may be formed above the electrode 12, outside the sealing region 4. The electrode 12 has a function to be one of an anode and a cathode of the photoelectric conversion element.

As the electrode 12, it is possible to use, for example, a metal oxide material such as an indium oxide, a zinc oxide, a tin oxide, an indium tin oxide (ITO), a fluorine-doped tin oxide (FTO), a film (NESA or the like) fabricated by using electrically conductive glass made of indium, zinc, and an oxide, or a metal material such as gold, platinum, silver, copper, aluminum, molybdenum, titanium, tungsten, manganese, cobalt, nickel, or tin. In a case where light is made incident via the substrate 11, it is preferable that the electrode 12 has a light transmitting property and that ITO or FTO is used in particular. Further, as an electrode material, it is possible to use an organic conductive polymer, i.e., polyaniline and a derivative thereof, polythiophene and a derivative thereof, or the like. The electrode 12 is formed by film-forming a film of the above-described material, for example, by a vacuum deposition method, a sputtering method, an ion plating method, a plating method, a coating method, or the like.

The thickness of the electrode 12 is preferable to be 30 nm or more to 300 nm or less in a case of ITO. The thickness less than 30 nm heightens a sheet resistance and causes reduction of a photoelectric conversion efficiency. The thickness more than 300 nm lowers flexibility and a crack becomes apt to occur due to a stress. The sheet resistance of the electrode 12 is preferable to be low, and is preferable, for example, to be 10Ω/ or less. The electrode 12 may be made of a single layer or may be made of a stacked layer of layers constituted by materials with different work functions.

The photoelectric conversion layer 13 is provided to be in contact with an upper surface and a side surface of the electrode 12. The photoelectric conversion layer 13 has a function to carry out charge separation by energy of irradiated light such as sunlight.

The photoelectric conversion layer 13 has a buffer layer 13a provided above the electrode 12, a photoactive layer 13b provided above the buffer layer 13a, and a buffer layer 13c provided above the photoactive layer 13b. In FIG. 1, though the buffer layer 13a is in contact with the side surface of the electrode 12 and the photoactive layer 13b overlaps the side surface of the electrode 12 with the buffer layer 13a therebetween, a configuration is not limited thereto, and the photoactive layer 13b may be in contact with the side surface of the electrode 12. Further, though a level difference is provided between the photoactive layer 13b and the buffer layer 13c, the configuration is not limited thereto and the buffer layer 13a, the photoactive layer 13b, and the buffer layer 13c may have continuous surfaces as side surfaces. Further, the buffer layer 13a and the buffer layer 13c are not necessarily required to be provided.

The buffer layer 13a is an intermediate layer between the electrode 12 and the photoactive layer 13b, while the buffer layer 13c is an intermediate layer between the photoactive layer 13b and the electrode 14. One of the buffer layer 13a and the buffer layer 13c has a function as a positive hole transport layer, and the other has a function as an electron transport layer (or a positive hole block layer). For example, when the electrode 12 is the cathode, the buffer layer 13a has the function as the electron transport layer. Further, when the electrode 14 is the anode, the buffer layer 13c has the function as the positive hole transport layer. Further, the buffer layer 13a may have a function as a planarization layer.

The positive hole transport layer has a function to transport a positive hole efficiently and a function to prevent annihilation of an exciton generated in a neighborhood of an interface with the photoactive layer 13b. As the positive hole transport layer, it is possible to use a polythiophene-based polymer such as PEDOT/PSS (poly(3,4-ethylene dioxythiophene)-poly(styrenesulfonate)), or an organic conductive polymer such as polyaniline or polypyrrole. Examples of a typical product of the polythiophene-based polymer include CleviosPH500, CleviosPH, CleviosPV P Al 4083, CleviosHIL1.1 manufactured by H. C. Starck. Further, an inorganic material such as a molybdenum oxide may be used as the positive hole transport layer.

The positive hole transport layer is formed, for example, by using a spin coat method. For example, after a coating layer of a desired thickness which is made of a material applicable to the positive hole transport layer is formed by the spin coat method, the coating layer is dried by heating by a hot plate or the like, whereby the positive hole transport layer can be formed. For example, it is preferable to dry by heating at 140 to 200° C. for a several minutes to about 10 minutes. Further, a solution to be applied is desirable to be filtrated by a filter in advance.

The electron transport layer has a function to block the positive hole and transport only the electron efficiently and a function to prevent annihilation of an exciton generated in an interface with the photoactive layer 13b. As the electron transport layer, for example, a metal oxide can be used. Examples of the metal oxide include an amorphous titanium oxide which can be obtained by hydrolyzing titanium alkoxide by using a sol-gel method. The electron transport layer is formed, for example, by using the spin coat method.

As the photoactive layer 13b, for example, a bulk hetero junction type photoactive layer can be used. The bulk hetero junction type photoactive layer has a micro layer isolation structure of a p-type semiconductor and an n-type semiconductor which are mixed in the photoactive layer. In the photoelectric conversion device, the mixed p-type semiconductor and n-type semiconductor form a nano-order sized pn junction in the photoactive layer 13b, and an electric current can be obtained by using photoelectric charge separation which occurs in a junction surface as a result that light is made incident. At least one of the p-type semiconductor and the n-type semiconductor may be an organic semiconductor.

The p-type semiconductor is constituted by a material having an electron donating property. As the p-type semiconductor device, it is possible to use, for example, polythiophene and a derivative thereof, polypyrrole and a derivative thereof, a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having aromatic amine in a side chain or a main chain, polyaniline and a derivative thereof, a phthalocyanine derivative, porphyrin and a derivative thereof, polyphenylene vinylene and a derivative thereof, polythienylene vinylene and a derivative thereof, or the like. Further, a copolymer of the above may be used, and, for example, a thiophene-fluorine copolymer, a phenylene ethynylene-phenylene vinylene copolymer or the like may be used.

As the p-type semiconductor, it is possible to use, for example, polythiophene being a conductive polymer having π conjugation and a derivative thereof. Polythiophene and the derivative thereof can secure excellent stereoregularity and is comparatively high in solubility to a solvent. Polythiophene and the derivative thereof are not limited in particular as long as polythiophene and the derivative thereof are chemical compounds having thiophene skeletal structures.

Concrete examples of polythiophene and the derivative thereof include polyalkylthiophene such as poly 3-methylthiophene, poly 3-butylthiophene, poly 3-hexylthiophene, poly 3-octylthiophene, poly 3-decylthiophene, or poly 3-dodecylthiophene; polyarylthiophene such as poly 3-phenylthiophene or poly 3-(p-alkylphenylthiophene); and polyalkylisothionaphthene such as poly 3-butylisothionaphthene, poly 3-hexylisothionaphthene, poly 3-octylisothionaphthene, or poly 3-decylisothionaphthene; and polyethylene dioxythiophene.

Further, it is possible to use a derivative such as PCDTBT (poly[N-9″-hepta-decanyl-2,7-carbazole-alto-5,5-(4′,7′-di-2-thienyl-2′,1′,3′-benzothiadiazole)]) being a copolymer constituted by carbazole, benzothiadiazole and thiophene. Usage of the above-described derivative can heighten the photoelectric conversion efficiency.

The n-type semiconductor device is constituted by a material having an electron accepting property. As the n-type semiconductor device, for example, fullerene and a derivative thereof are suitably used. The fullerene derivative is not limited in particular as long as the fullerene derivative is a derivative having a fullerene framework. Examples thereof include derivatives whose basic frameworks are C60, C70, C76, C78, and C84. The fullerene derivative may be one whose carbon atoms in the fullerene framework are modified by arbitrary functional groups, and these functional groups may be bonded each other to form a circle. The fullerene derivative also includes a fullerene-bonded polymer. The fullerene derivative which has a functional group high in affinity to a solvent and has high solubility to the solvent is preferable.

Examples of the functional group in the fullerene derivative include: a hydrogen atom; a hydroxyl group; a halogen atom such as a fluorine atom or a chlorine atom; an alkyl group such as a methyl group or an ethyl group; an alkenyl group such as a vinyl group; a cyano group; an alkoxy group such as a methoxy group or an ethoxy group; an aromatic hydrocarbon group such as a phenyl group or a naphthyl group; and an aromatic heterocyclic group such as a thienyl group or a pyridyl group. Concrete examples include a fullerene hydride such as C60H36 or C70H36, an oxide fullerene such as C60 or C70, and a fullerene metal complex. Among the aforementioned ones, as the fullerene derivative, it is especially preferable to use 60PCBM ([6,6]-phenyl C61 butyric acid methylester) or 70PCBM ([6,6]-phenyl C71 butyric acid methylester).

When unmodified fullerene is used, it is preferable to use C70. A photo carrier generation efficiency of fullerene C70 is high, and thus fullerene C70 is suitable to be used in a photoelectric conversion device.

A mixture ratio (n:p) of the n-type semiconductor and the p-type semiconductor in the photoactive layer is preferable to be about 1:1 in a case where the p-type semiconductor is of P3AT series. Further, in a case where the p-type semiconductor is of PCDTBT series, the ratio is preferable to be about 4:1.

By applying a solution obtained by dissolving a mixture of those p-type semiconductor and n-type semiconductor in a solvent, the photoactive layer 13b is film-formed. Therefore, it is possible to manufacture a low-cost and a large-area photoelectric conversion device by a printing method or the like by using an inexpensive facility.

In order for application, the organic semiconductor is required to be dissolved in the solvent. Examples of the solvent include an unsaturated hydrocarbon-based solvent such as toluene, xylene, tetralin, decalin, mesitylene, n-butylbenzene, sec-butylbenzene, or tert-butylbenzene, an aromatic hydrocarbon halide-based solvent such as chlorobenzene, dichlorobenzene, or trichlorobenzene, a saturated hydrocarbon halide-based solvent such as carbon tetrachloride, chloroform, dichloromethane, dichloroethane, chlorobutane, bromobutane, chloropentane, chlorohexane, bromohexane, or chlorocyclohexane, and esters such as tetrahydrofuran or tetrahydropyran. A halogen-based aromatic solvent is especially preferable. These solvents can be used singly or by being mixed.

Examples of a method of forming the film by applying the organic semiconductor include a spin coat method, a dip coating method, a casting method, a bar coating method, a roll coating method, a wire bar coating method, a spray method, a screen printing method, a gravure printing method, a flexographic printing method, an offset printing method, a gravure offset printing method, a dispenser method, a nozzle coating method, a capillary coating method, and an ink-jet method, and these coating methods can be used singly or in combination.

The electrode 14 is provided above and in contact with the photoelectric conversion layer 13 (buffer layer 13c in FIG. 1). The electrode 14 is provided in a manner to extend from the inside of the sealing region 4 to the outside thereof. Another electrode to be an electrode pad may be formed above the electrode 14, outside the sealing region 4. The electrode 14 is separated from the electrode 12 with the photoelectric conversion layer 13 therebetween. The electrode 14 has a function as the other of the anode and the cathode.

As the electrode 14, for example, metal, a metal oxide, or the like applicable to the electrode 12 can be used. In a case where light is made incident via the counter substrate 2, the electrode 14 has a light transmitting property. Further, in a case where the electrode 14 is in contact with the electron transport layer, it is preferable to use a material with a low work function as the electrode 14. Examples of the material with the low work function include alkali metal and alkali-earth metal. Concrete examples include Li, In, Al, Ca, Mg, Sm, Tb, Yb, Zr, Na, K, Rb, Cs, Ba, and alloys of the above.

The electrode 14 may be made of a single layer or may be made of a stacked layer of a plurality of layers constituted by materials with different work functions. Further, the electrode 14 may be made of an alloy of one or more of materials with the low work functions and gold, silver, platinum, copper, manganese, titanium, cobalt, nickel, tungsten, tin or the like. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy.

A thickness of the electrode 14 is preferable, for example, to be 1 nm or more to 500 nm or less, more preferably to be 10 nm or more to 300 nm or less. When the electrode 14 is thinner than 1 nm, an electric resistance becomes high and a generated charge becomes hard to be taken out. When the electrode 14 is thicker than 500 nm, it takes a long time to film-form the electrode 14 and a material temperature rises, so that the photoelectric conversion layer 13 is damaged, bringing about deterioration of a performance. Further, since a large amount of material is used, a time to occupy a film-forming device is long, which leads to a cost increase.

The electrode 14 is formed by film-forming the above-described conductive material, for example, by a vacuum deposition method, a sputtering method, an ion plating method, a plating method, a coating method, or the like.

The impurity detection layer 15 is in contact with an upper surface and a side surface of the electrode 14, the photoelectric conversion layer 13 (the photoactive layer 13b and the buffer layer 13c), and the substrate 11. At this time, the electrode 14 is separated from the electrode 12 with the impurity detection layer 15 therebetween. The impurity detection layer 15 is preferable to be provided along at least a part of a periphery of a contact surface between the photoelectric conversion layer 13 and the electrode 14. The periphery of the contact surface between the photoelectric conversion layer 13 and the electrode 14 is apt to be deteriorated in particular, and by applying the above-described structure, the impurity detection layer 15 functions as a protection layer of the photoelectric conversion layer 13, so that deterioration of the photoelectric conversion layer 13 can be suppressed.

The impurity detection layer 15 is a layer to detect an impurity inside the sealing region 4. As a result that the impurity detection layer 15 causes chemical reaction with an impurity containing at least one of oxygen and water (vapor or the like), at least one of an electric resistance value and a color changes. Examples of chemical reaction include oxidation reaction and hydroxylation reaction.

As the impurity detection layer 15, for example, it is possible to use a material in which at least one of an electric resistance value and a color changes, and examples thereof include alkali metal such as Na or K, alkali earth metal such as Ca, Sr, or Ba, an oxide of alkali earth metal such as Cao, SrO, or BaO, and a hydroxide of alkali earth metal such as $Ca(OH)_2$, $Sr(OH)_2$, or $Ba(OH)_2$. The impurity detection layer 15 is preferable to contain a material which causes at least one of oxidation reaction and hydroxylation reaction with the impurity. For example, Ca is inexpensive, and its state is easy to be observed since Ca becomes transparent by oxidation or hydroxylation. Not being limited by the above, it is possible to use, for example, silica gel, a zeolite-based chemical compound, a sulfate such as a magnesium sulfate, a sodium sulfate, or a nickel sulfate, a metal complex such as an aluminum complex, an organic metallic compound such as an aluminum oxide octylate, or the like. Note that the impurity detection layer 15 may be constituted by using the plurality of above-described materials.

The impurity detection layer 15 is formed by film-forming a film of the above-described material, for example, by the vacuum deposition method, the sputtering method, the ion plating method, the plating method, the coating method, or the like. Note that a part of the film may be removed by etching or the like after film-formation.

A length, a width, a thickness and so on of the impurity detection layer 15 can be set properly in correspondence with a largeness of a cell or module to be manufactured or a concentration of impurities at a manufacturing time. In a case where the electric resistance value of the impurity detection layer 15 changes by chemical reaction with the impurity, the electric resistance value of the impurity detection layer 15 can be adjusted by changing the length, the width, the thickness or the like of the impurity detection layer 15.

Figure 2:
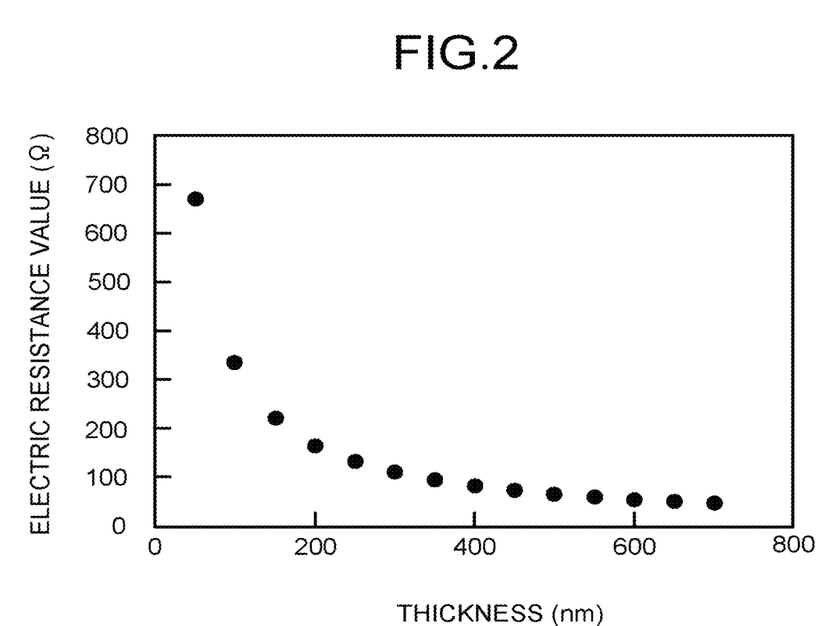
FIG. 2 is a chart showing a relation between a thickness of a Ca film and an electric resistance value.

FIG. 2 is a chart showing a relation between a thickness of a Ca film used as the impurity detection layer 15 and an electric resistance value. An electric resistivity of the Ca film at 20° C. is 33.6 nΩm. The electric resistance value of the Ca film of 1 cm in length and 0.1 cm in width becomes exponentially larger as the thickness becomes smaller, as shown in FIG. 2. From this fact, it is understood that the electric resistance value of the impurity detection layer 15 can be adjusted by changing the thickness of the impurity detection layer 15. Further, it is possible to set an electric resistance to be a reference in correspondence with a size of the impurity detection layer 15 in advance, and to decide whether or not the photoelectric conversion device is a good product by comparing the electric resistance value of the impurity detection layer 15 and the electric resistance value to be the reference.

When the Ca film reacts with oxygen in the impurity (oxidation reaction), a surface of the Ca film is altered to be a CaO film whose electric resistivity is higher than that of the Ca film. Further, when the Ca film reacts with water in the impurity (hydroxylation reaction), the surface of the Ca film is altered to be a $Ca(OH)_2$ film whose electric resistivity is higher than that of the Ca film. The above-described reaction proceeds gradually from the surface of the Ca film and an unreacted region of the Ca film becomes smaller when the reaction proceeds, so that the electric resistance value of the entire film is increased (becomes highly resistive). The above-described reaction proceeds faster as the impurity amount becomes larger. Therefore, the larger the impurity amount is, the shorter a time to become highly resistive is. As described above, the electric resistance value of the impurity detection layer 15 changes with progress of the chemical reaction between the impurity detection layer 15 and the impurity. Note that based on the above-described property it is also possible to make the impurity detection layer 15 function as a drying agent.

Further, in a case where the color of the impurity detection layer 15 changes by chemical reaction with the impurity, the thickness of the impurity detection layer 15 is preferable to be equal to or larger than a penetration length of light to a plasma frequency. By the above, it is possible to facilitate observation of change of the color of the impurity detection layer 15 from the outside.

The electrode 16 extends along the substrate 11 to the outside of the sealing region 4. Though the plurality of electrodes 16 are provided, the number of the electrodes 16 is not limited to the number shown in FIG. 1. Further, inside the sealing region 4, though the impurity detection layer 15 is provided above the electrode 16, the configuration is not limited thereto, and the electrode 16 may be provided above the impurity detection layer 15. The electrode 16 is separated from the electrode 12 with at least the photoelectric conversion layer 13 therebetween. Further, the electrode 16 is separated from the electrode 14 and the photoelectric conversion layer 13 with the impurity detection layer 15 therebetween.

The electrode 16 has a function as an auxiliary electrode for measuring the electric resistance value of the impurity detection layer 15. For example, probe pins or the like are put to the electrode 14 and the electrode 16 or to the plurality of electrodes 16, to measure the electric resistance value between the electrode 14 and the electrode 16 or between the plurality of electrodes 16 by using a tester or the like, whereby the electric resistance value of the impurity detection layer 15 can be measured. Note that another electrode to be an electrode pad may be provided above the electrode 16, outside the sealing region 4.

As the electrode 16, for example, the material applicable to the electrode 12 and the electrode 14 can be used. The electrode 16 is preferable to be low in reactivity to water, oxygen, and the organic material and to have a high electrical conduction. A width of the electrode 16 is smaller than widths of the electrode 12 and the electrode 14, but a length, the width, a thickness, or the like of the electrode 16 is not limited in particular. Further, the electrode 16 can be formed by using the forming method applicable to the electrode 12 and the electrode 14.

The counter substrate 2 is provided in a manner to face at least a part of the element substrate 1. In FIG. 1, the counter substrate 2 is processed to have a cross-sectional shape of a recessed shape, but the counter substrate 2 is not limited thereto and may have a plate shape. As the counter substrate 2, for example, the material applicable to the substrate 11 can be used. In a case where light is made incident via the counter substrate 2 or in a case where change of the color of the impurity detection layer 15 is observed from the outside, the counter substrate 2 is preferable to have a light transmitting property.

The sealing layer 3 is provided to be fixed to the element substrate 1 and the counter substrate 2, in a manner that the sealing region 4 which seals at least the photoelectric conversion layer 13 is formed between the element substrate 1 and the counter substrate 2. For example, the sealing layer 3 is provided in a manner to surround the photoelectric conversion layer 13. At this time, the sealing layer 3 is also provided above a part of the electrode 12 above the substrate 11, the electrode 14, and the electrode 16. Note that though the sealing layer 3 has regions with small widths in overlapping portions with the electrode 12 and the electrode 14, the region with the small width is not necessarily required to be provided. Further, a region with a small width may be provided in an overlapping portion with the electrode 16. As the sealing layer 3, it is possible to use, for example, a glass frit, a thermosetting or light-curing resin, or the like.

As described above, the photoelectric conversion device of the present embodiment is provided with the impurity detection layer causing chemical reaction with the impurity and the auxiliary electrode for measuring the electric resistance value of the impurity detection layer, whereby the impurity amount inside the sealing region can be detected simply. Therefore, for example, since a sealing state of a product can be checked before shipment by measuring the electric resistance value of the impurity detection layer, it is possible to increase reliability to a quality.

Figure 3A:
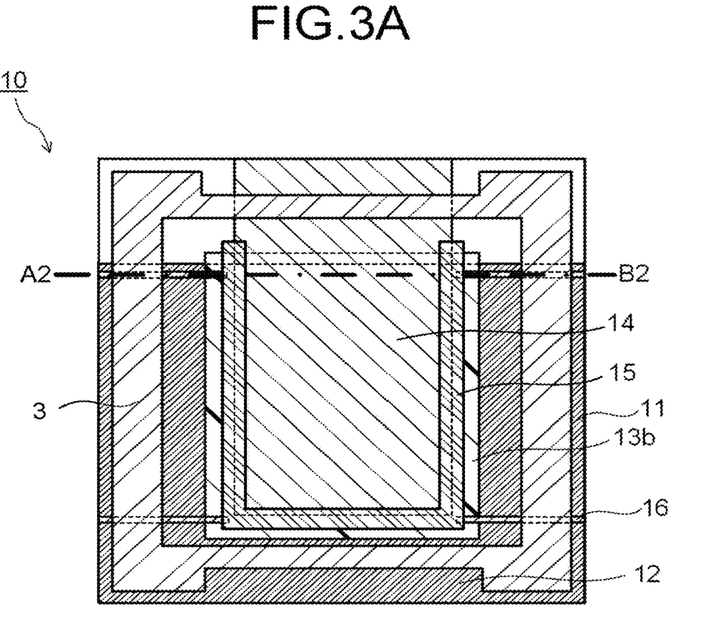
FIG. 3A is a plan view showing a structure example of a photoelectric conversion device.
Figure 3B:
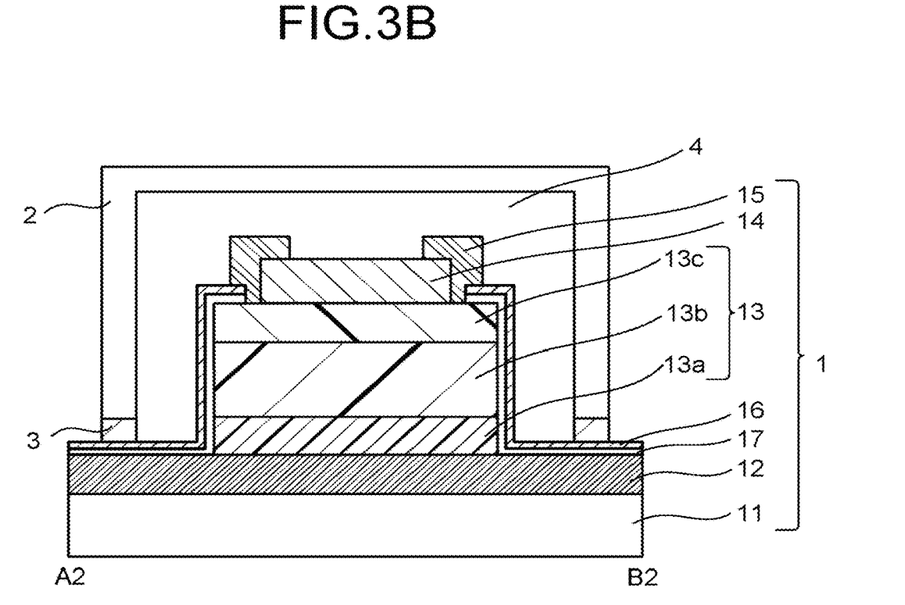
FIG. 3B is a cross-sectional view showing the structure example of the photoelectric conversion device.

Note that the photoelectric conversion device of the embodiment is not limited to that of a structure shown in FIG. 1. FIG. 3 are views showing a structure example of the photoelectric conversion device, FIG. 3A being a plan view and FIG. B being a cross-sectional view taken along a line A2-B2 in FIG. 3A. Note that in the photoelectric conversion device shown in FIG. 3, explanation of FIG. 1 can be properly used for a portion (for example, a component with the same reference numeral, or the like) similar to that in the photoelectric conversion device shown in FIG. 1.

The photoelectric conversion device 10 shown in FIG. 3 has an element substrate 1, a counter substrate 2, and a sealing layer 3, similarly to the photoelectric conversion device 10 shown in FIG. 1. Further, the photoelectric conversion device 10 further has a sealing region 4 surrounded by the element substrate 1, the counter substrate 2, and the sealing layer 3. Note that in FIG. 3A the counter substrate 2 is omitted for the sake of convenience.

The element substrate 1 has a substrate 11, an electrode 12 provided above the substrate 11, a photoelectric conversion layer provided above the electrode 12, an electrode 14 provided above the photoelectric conversion layer 13, an impurity detection layer 15 provided inside a sealing region 4 in a manner to be in contact with the electrode 14, an electrode 16 which is in contact with the impurity detection layer 15 and extends to the outside of the sealing region 4, and an insulating layer 17 which is in contact with the photoelectric conversion layer 13 and the impurity detection layer 15 and extends to the outside of the sealing region 4. The photoelectric conversion device 10 shown in FIG. 3 is different from the photoelectric conversion device 10 shown in FIG. 1 at least in that the photoelectric conversion device 10 shown in FIG. 3 newly has the insulating layer 17. Since explanation of FIG. 1 can be properly used for the component the same as that in FIG. 1, explanation will be omitted here.

In FIG. 3, the electrode 16 is provided above the insulating layer 17. The electrode 16 extends along the insulating layer 17 to the outside of the sealing region 4, while being separated from the photoelectric conversion layer 13 with the insulating layer 17 therebetween. Thereby, even if the electrode 16 is provided along the photoelectric conversion layer 13, it is possible to suppress deterioration of the photoelectric conversion layer 13 due to the electrode 16 as well as leakage of an electric charge or the like due to the electrode 16. Further, since the electrode 16 can extend even above the electrode 12, an area of the electrode 12 can be made large as shown in FIG. 3.

The insulating layer 17 has a function as a protection layer to suppress deterioration of the photoelectric conversion layer 13. As the insulating layer 17, it is possible to use, for example, a resin material such as a polyester resin, a polyethylene resin, a vinyl chloride resin, a polystyrene resin, a phenol resin, a melamine resin, an epoxy resin, or a silicone resin, an oxide layer such as a silicon dioxide, a nitride layer such as a boron nitride or a silicon nitride, or the like. The insulating layer 17 is formed, for example, by using a coating method, a printing method, a plating method, or the like.

As described above, the photoelectric conversion layer shown in FIG. 3 is provided with the insulating layer below the auxiliary electrode, whereby, in addition to detecting the impurity amount in the sealing region simply, it is possible to suppress deterioration of the photoelectric conversion layer, leakage of the electric charge or the like due to the auxiliary electrode even if the auxiliary electrode is provided along the photoelectric conversion layer.

(Second Embodiment)

Figure 4A:
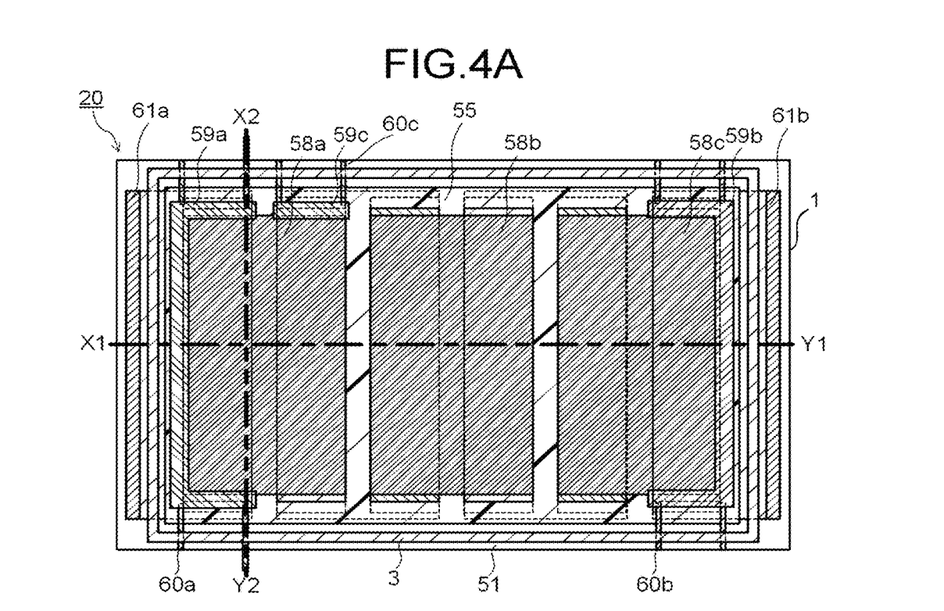
FIG. 4A is a plan view showing a structure example of a photoelectric conversion device.
Figure 4B:
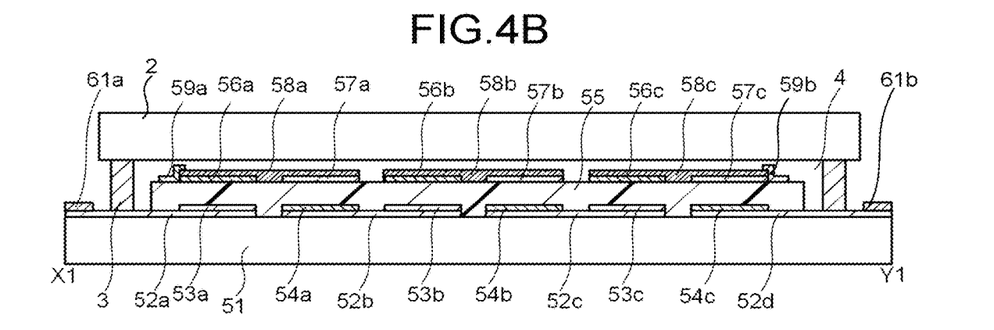
FIG. 4B is a plan view showing the structure example of the photoelectric conversion device.
Figure 4C:
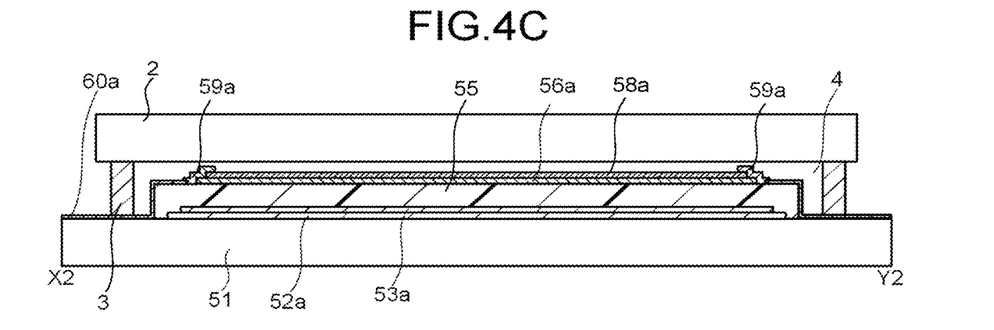
FIG. 4C is a cross-sectional view showing the structure example of the photoelectric conversion device.

FIG. 4 are views showing a structure example of a photoelectric conversion device being a solar power generation module, FIG. 4A being a plan view, FIG. 4B being a cross-sectional view taken along a line X1-Y1 in FIG. 4A, and FIG. 4C being a cross-sectional view taken along a line X2-Y2 in FIG. 4A. Note that in the photoelectric conversion device shown in FIG. 4, explanation of FIG. 1 and FIG. 3 can be properly used for portions similar to those in the photoelectric conversion device shown in FIG. 1 and FIG. 3

The photoelectric conversion device 20 shown in FIG. 4 has an element substrate 1, a counter substrate 2, and a sealing layer 3. Further, the photoelectric conversion device 20 has a sealing region 4 surrounded by the element substrate 1, the counter substrate 2, and the sealing layer 3. Note that in FIG. 4A, the counter substrate 2 is omitted for the sake of convenience.

The element substrate 1 has a substrate (also referred to as an element formation substrate) 51, an electrode 52a to an electrode 52d, a buffer layer 53a to a buffer layer 53c, a buffer layer 54a to a buffer layer 54c, a photoactive layer 55, a buffer layer 56a to a buffer layer 56c, a buffer layer 57a to a buffer layer 57c, an electrode 58a to an electrode 58c, an impurity detection layer 59a to an impurity detection layer 59c, an electrode 60a and an electrode 60b, and an electrode 61a and an electrode 61b. The buffer layer 53a to the buffer layer 53c, the buffer layer 54a to the buffer layer 54c, the photoactive layer 55, the buffer layer 56a to the buffer layer 56c, and the buffer layer 57a to the buffer layer 57c have a function as a photoelectric conversion layer, and are sealed by the sealing region 4.

As the substrate 51, the material applicable to the substrate 11 can be used. Incidentally, since explanation of the substrate 11 can be properly used for explanation of the substrate 51, explanation thereof will be omitted here.

The electrode 52a to the electrode 52d are provided above the substrate 51 while being separated from one another. The electrode 52a and the electrode 52d extend from the inside of the sealing region 4 to the outside of the sealing region 4. The electrode 52b and the electrode 52c are provided inside the sealing region 4.

As the electrode 52a to the electrode 52d, the material applicable to the electrode 12 can be used. Incidentally, since explanation of the electrode 12 can be properly used for explanation of the electrode 52a to the electrode 52d, explanation thereof will be omitted here.

The buffer layer 53a is provided above the electrode 52a. The buffer layer 53b is provided above the electrode 52b. The buffer layer 53c is provided above the electrode 52c. The buffer layer 54a is provided above the electrode 52b. The buffer layer 54b is provided above the electrode 52c. The buffer layer 54c is provided above the electrode 52d.

The photoactive layer 55 is provided above the buffer layer 54a to the buffer layer 54c in a manner to extend from the electrode 52a to the electrode 52d.

As the photoactive layer 55, for example, the material applicable to the photoactive layer 13b can be used. Incidentally, since explanation of the photoactive layer 13b can be properly used for explanation of the photoactive layer 55, explanation thereof will be omitted here.

The buffer layer 56a to the buffer layer 56c are provided above the photoactive layer 55. The buffer layer 56a overlaps the buffer layer 53a with the photoactive layer 55 therebetween. The buffer layer 56b overlaps the buffer layer 53b with the photoactive layer 55 therebetween. The buffer layer 56c overlaps the buffer layer 53c with the photoactive layer 55 therebetween. The buffer layer 57a to the buffer layer 57c are provided above the photoactive layer 55. The buffer layer 57a overlaps the buffer layer 54a with the photoactive layer 55 therebetween. The buffer layer 57b overlaps the buffer layer 54b with the photoactive layer 55 therebetween. The buffer layer 57c overlaps the buffer layer 54c with the photoactive layer 55 therebetween.

The buffer layer 53a to the buffer layer 53c, and the buffer layer 57a to the buffer layer 57c have a function as one of an electron transport layer and a positive hole transport layer. The buffer layer 54a to the buffer layer 54c, and the buffer layer 56a to the buffer layer 56c have a function as the other of the electron transport layer and the positive hole transport layer. In other words, the photoelectric conversion device 20 shown in FIG. 4 can be regarded as in a state where a plurality of photoelectric conversion elements are electrically connected in series. As the electron transport layer and the positive hole transport layer, for example, an electron transport layer and a positive hole transport layer made of a material applicable to the buffer layer 13a and the buffer layer 13c can be used.

The electrode 58a is provided above the photoactive layer 55 with the buffer layer 56a and the buffer layer 57a therebetween. The electrode 58b is provided above the photoactive layer 55 with the buffer layer 56b and the buffer layer 57b therebetween. The electrode 58c is provided above the photoactive layer 55 with the buffer layer 56c and the buffer layer 57c therebetween. Note that each of an overlapping portion of the electrode 58a and the electrode 52a, an overlapping portion of the electrode 58a and the electrode 52b, an overlapping portion of the electrode 58b and the electrode 52b, an overlapping portion of the electrode 58b and the electrode 52c, an overlapping portion of the electrode 58c and the electrode 52c, and an overlapping portion of the electrode 58c and the electrode 52d can be regarded as one photoelectric conversion cell. At this time, the photoelectric conversion device 20 can be regarded as having a structure in which the plurality of photoelectric conversion cells are electrically connected in series.

As the electrode 58a to the electrode 58c, the material applicable to the electrode 14 can be used. Incidentally, since explanation of the electrode 14 can be properly used for explanation of the electrode 58a to the electrode 58c, explanation thereof will be omitted here.

The impurity detection layer 59a is provided to be in contact with an upper surface and a side surface of the electrode 58a, and the photoactive layer 55, along at least a part of a periphery of a contact surface between the photoactive layer 55 and the buffer layer 56a, and the electrode 58a. At this time, by providing the impurity detection layer 59a in a manner not to extend to the electrode 58b, it is possible to prevent short circuit between the electrode 58a and the electrode 58b via the impurity detection layer 59a. Note that the impurity detection layer 59a may be provided in a manner to surround a periphery of a contact surface between the photoactive layer 55, the buffer layer 56a and the buffer layer 57a, and the electrode 58a.

The impurity detection layer 59b is provided to be in contact with an upper surface and a side surface of the electrode 58c, and the photoactive layer 55, along at least a part of a periphery of a contact surface between the photoactive layer 55 and the buffer layer 57c, and the electrode 58a. At this time, by providing the impurity detection layer 59b in a manner not to extend to the electrode 58b, it is possible to prevent short circuit between the electrode 58a and the electrode 58b via the impurity detection layer 59a. Note that the impurity detection layer 59b may be provided in a manner to surround a periphery of a contact surface between the photoactive layer 55, the buffer layer 56c and the buffer layer 57c, and the electrode 58c.

Note that the impurity detection layer may be provided to be in contact with an upper surface and a side surface of the electrode 58b, and the photoactive layer 55, along at least a part of a periphery of a contact surface between the photoactive layer 55, the buffer layer 56b and the buffer layer 57b, and the electrode 58a.

The impurity detection layer 59c is provided along at least a part of a periphery of a contact surface between the photoactive layer 55 and the buffer layer 57a, and the electrode 58a. As described above, by dividing the impurity detection layer per photoelectric conversion cell, it is possible to suppress influence of the impurity detection layer to another photoelectric conversion cell. The impurity detection layer may be provided, not being limited by the above, for example, along each of at least a part of a periphery of a contact surface between the photoactive layer 55 and the buffer layer 56b, and the electrode 58c, at least a part of a periphery of a contact surface between the photoactive layer 55 and the buffer layer 57b, and the electrode 58b, and at least a part of a periphery of a contact surface between the photoactive layer 55 and the buffer layer 56c, and the electrode 58c.

The electrode 60a is in contact with the impurity detection layer 59a and extends along the photoactive layer 55 and the substrate 51 to the outside of the sealing region 4. The electrode 60a is separated from the electrode 52a with the photoactive layer 55 therebetween. The electrode 60b is in contact with the impurity detection layer 59b and extends along the photoactive layer 55 and the substrate 51 to the outside of the sealing region 4. The electrode 60b is separated from the electrode 52d with the photoactive layer 55 therebetween. Note that as shown in FIG. 4, the plurality of electrodes 60a and the plurality of electrodes 60b may be provided. Further, an insulating layer equivalent to the insulating layer 17 may be provided below the electrode 60a and the electrode 60b. Further, other electrodes to be electrode pads may be provided above the electrode 60a and the electrode 60b.

The electrode 61a is provided above the electrode 52a outside the sealing region 4. The electrode 61b is provided above the electrode 52d outside the sealing region 4. The electrode 61a and the electrode 61b have functions as electrode pads, and as a result that the photoelectric conversion device 20 is electrically connected, for example, to a load in parallel via the electrode 61a and the electrode 61b, it is possible to supply an electric current to the load. At this time, one of the electrode 61a and the electrode 61b becomes an anode and the other thereof becomes a cathode.

The counter substrate 2 is provided in a manner to face a part of the element substrate 1. At this time, the electrode 61a and the electrode 61b are preferable not to overlap the counter substrate 2. Incidentally, explanation in the first embodiment can be properly used for explanation of the counter substrate 2.

The sealing layer 3 is provided in a manner to surround the photoactive layer 55. The sealing layer 3 is provided to be fixed to the element substrate 1 and the counter substrate 2, in a manner that the sealing region 4 is formed between the element substrate 1 and the counter substrate 2. At this time, the sealing layer 3 is also provided above a part of the electrode 52a, the electrode 52d, and the electrode 60a to the electrode 60c. Incidentally, for explanation of the sealing layer 3, explanation in the first embodiment can be properly used.

As described above, the photoelectric conversion device of the present embodiment has the plurality of first electrodes, the photoelectric conversion layer which is provided above the plurality of first electrodes, and the plurality of second electrodes which are provided above the photoelectric conversion layer and overlap the two first electrodes different from each other with the photoelectric conversion layer therebetween. Thereby, the structure can be regarded as a structure similar to that when a plurality of photoelectric conversion cells are electrically connected in series, so that output voltage can be made large.

EXAMPLES

Figure 5:
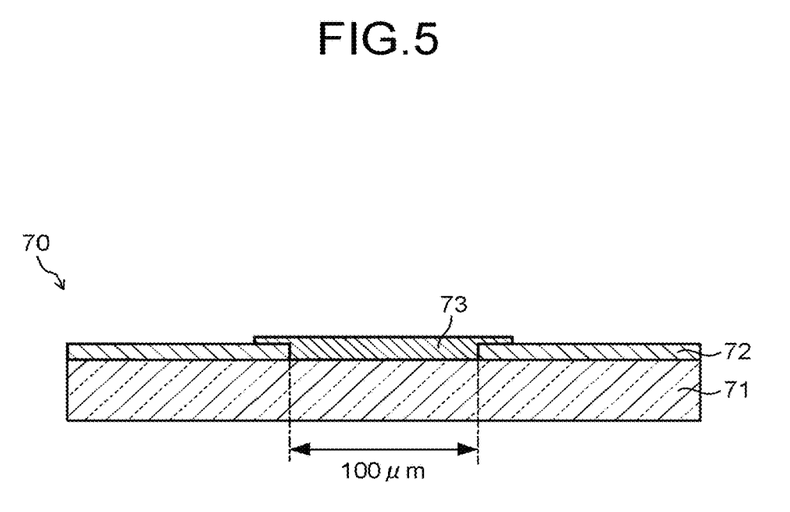
FIG. 5 is a cross-sectional view showing a structure of an evaluation sample.

FIG. 5 is a view showing a structure of an evaluation sample. As shown in FIG. 5, a plurality of wiring layers 72 are formed by film-forming metal stacked films of Mo/Al/Mo above a part of a glass substrate 71 by using a vapor deposition method. At this time, a line width of the wiring layer 72 is 400 µm and an interval of the plurality of wiring layers 72 is 100 µm. Next, an impurity detection layer 73 is formed by film-forming a Ca film between the plurality of wiring layers 72 by using the vapor deposition method, whereby the evaluation sample 70 is fabricated. As the evaluation samples, there are fabricated a plurality of evaluation samples which have the impurity detection layers having thicknesses different from one another. Next, an electric resistance value of the impurity detection layer 73 is measured by measuring an electric resistance value between the wiring layers 72 under a circumstance where moisture of 2.5 ppm and oxygen of 0.4 ppm or less are contained, and change of a color of the impurity detection layer 73 is observed.

Figure 6:
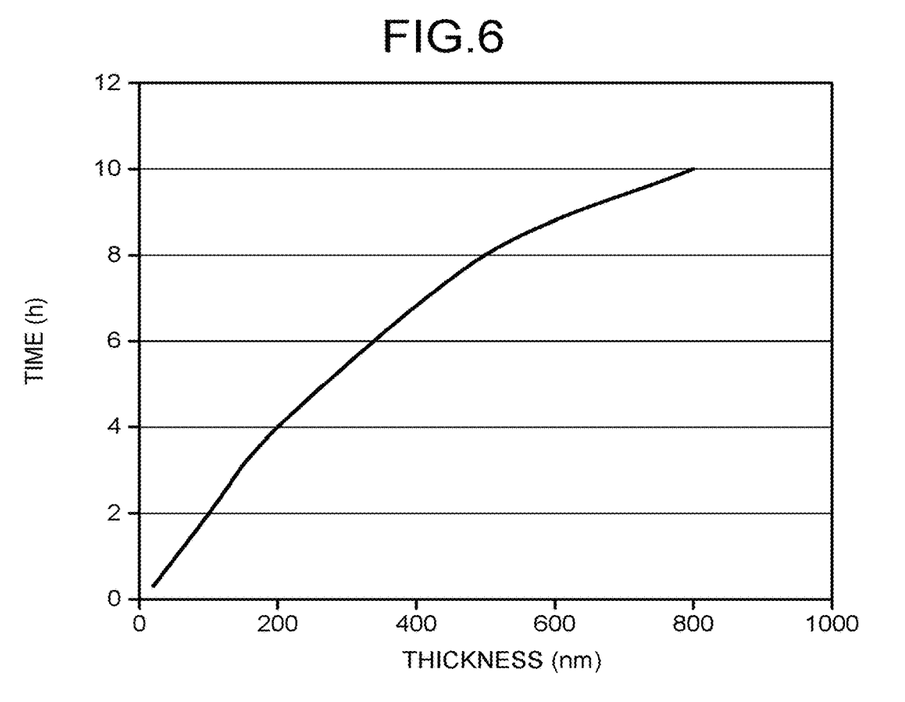
FIG. 6 is a chart showing a relation between a thickness of an impurity detection layer and a time until the impurity detection layer becomes transparent.

FIG. 6 is a chart showing a relation between a thickness (nm) of the impurity detection layer 73 and a time (h) until the impurity detection layer 73 becomes transparent. As shown in FIG. 6, it is understood that the time until the impurity detection layer 73 becomes transparent is longer as the impurity detection layer 73 becomes thicker. From this fact, as described above, it can be said that the impurity detection layer 73 is apt to have a higher resistance as its thickness becomes thinner.

Figure 7A:
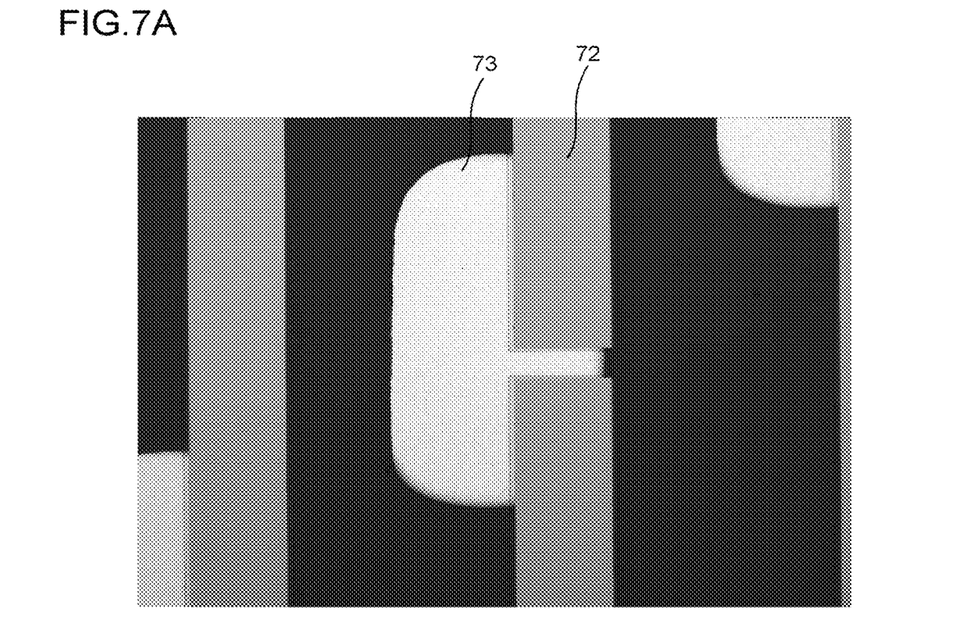
FIG. 7A is a plan photograph of the evaluation sample by optical microscope observation.
Figure 7B:
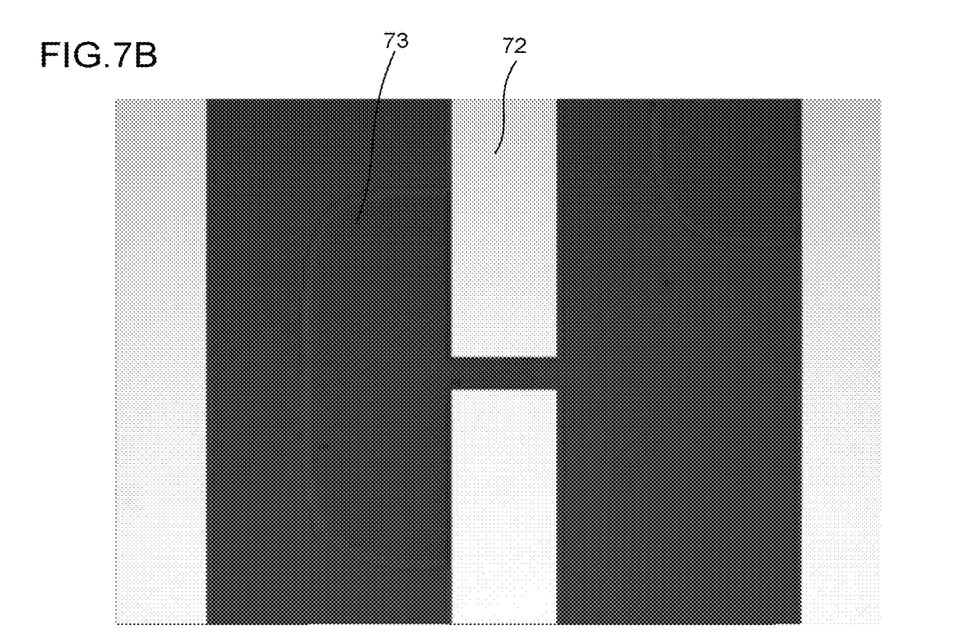
FIG. 7B is a plan photograph of the evaluation sample by optical microscope observation.

FIG. 7 are plan photographs of the evaluation sample by optical microscope observation. The sample shown in FIG. 7A is the sample directly after formation of the impurity detection layer 73, while the sample shown in FIG. 7B is the sample after being left for two hours under the above-described circumstance after formation of the impurity detection layer 73. On this occasion, the sample of 100 nm in thickness of the impurity detection layer 73 is used as the sample.

In FIG. 7A, it is found that the impurity detection layer 73 is opaque (white portion). The electric resistance value at this time is 1Ω or less. In contrast, in FIG. 7B, it is found that the impurity detection layer 73 has changed to be transparent (black portion). The electric resistance value at this time is over-range (OL) of 10 MΩ or more. From this fact, it is understood that an impurity amount in the sealing region is measurable by measuring the electric resistance value of the impurity detection layer 73.

The above-described embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A photoelectric conversion device comprising:
    an element substrate having a first electrode, a photoelectric conversion layer, and a second electrode, the photoelectric conversion layer being provided above the first electrode and performing charge separation by energy of irradiated light, and the second electrode being provided above the photoelectric conversion layer and being separated from the first electrode;
    a counter substrate facing the element substrate; and
    a sealing layer provided between the element substrate and the counter substrate, wherein the element substrate, the counter substrate, and the sealing layer define a sealing region sealing the photoelectric conversion layer, and wherein the element substrate further comprises:

an impurity detection layer provided inside the sealing region, separated from the first electrode, being in contact with the second electrode, and configured to cause a chemical reaction with an impurity containing at least one of oxygen or water if the impurity enters the sealing region because of a failure of the sealing layer; and a third electrode being in contact with the impurity detection layer, separated from the first and second electrodes, and extending outside of the sealing region, wherein each of the first electrode and the second electrode extends outside of the sealing region.

2. The device of claim 1, wherein the impurity detection layer is provided along at least a part of a periphery of a contact surface between the photoelectric conversion layer and the second electrode.

3. The device of claim 1, wherein an electric resistance value of the impurity detection layer changes by the chemical reaction.

4. The device of claim 1, wherein the impurity detection layer contains a material causing at least one of oxidation reaction or hydroxylation reaction with the impurity.

5. The device of claim 4, wherein the impurity detection layer contains alkali metal, alkali-earth metal, an oxide of the alkali-earth metal, or a hydroxide of the alkali-earth metal.

6. The device of claim 4, wherein the impurity detection layer contains Ca.

7. The device of claim 1, wherein a thickness of the impurity detection layer is equal to or more than a penetration length of light to a plasma frequency.

8. The device of claim 1, wherein the element substrate further comprises a first buffer layer provided between the first electrode and the photoelectric conversion layer and a second buffer layer provided between the second electrode and the photoelectric conversion layer.

9. The device of claim 1, wherein the photoelectric conversion layer has an organic semiconductor.

10. A photoelectric conversion device comprising:

an element substrate having a first electrode, a photoelectric conversion layer, and a second electrode, the photoelectric conversion layer being provided above the first electrode and performing charge separation by energy of irradiated light, and the second electrode being provided above the photoelectric conversion layer and being separated from the first electrode;

a counter substrate facing the element substrate; and a sealing layer provided between the element substrate and the counter substrate, wherein the element substrate, the counter substrate, and the sealing layer define a sealing region sealing the photoelectric conversion layer, and wherein the element substrate further comprises:

an impurity detection layer provided inside the sealing region, separated from the first electrode, being in contact with the second electrode, and configured to cause chemical reaction with an impurity containing at least one of oxygen or water if the impurity enters the sealing region because of failure of the sealing layer;

a third electrode being in contact with the impurity detection layer, separated from the first and second electrodes, and extending outside of the sealing region; and an insulating layer being in contact with the impurity detection layer and the photoelectric conversion layer and extending outside of the sealing region, wherein the third electrode is separated from the photoelectric conversion layer with the insulating layer therebetween and extends along the insulating layer outside of the sealing region.

11. The device of claim 10, wherein the impurity detection layer is provided along at least a part of a periphery of a contact surface between the photoelectric conversion layer and the second electrode.

12. The device of claim 10, wherein an electric resistance value of the impurity detection layer changes by the chemical reaction.

13. The device of claim 10, wherein the impurity detection layer contains a material causing at least one of oxidation reaction or hydroxylation reaction with the impurity.

14. The device of claim 13, wherein the impurity detection layer contains alkali metal, alkali-earth metal, an oxide of the alkali-earth metal, or a hydroxide of the alkali-earth metal.

15. The device of claim 13, wherein the impurity detection layer contains Ca.

16. The device of claim 10, wherein a thickness of the impurity detection layer is equal to or more than a penetration length of light to a plasma frequency.

17. The device of claim 10, wherein the element substrate further comprises a first buffer layer provided between the first electrode and the photoelectric conversion layer and a second buffer layer provided between the second electrode and the photoelectric conversion layer.

18. The device of claim 10, wherein the photoelectric conversion layer has an organic semiconductor.

19. The device of claim 10, wherein each of the first electrode and the second electrode extends outside of the sealing region.

* * * * *